(12) United States Patent
Loebl et al.

(10) Patent No.: US 6,975,182 B2
(45) Date of Patent: Dec. 13, 2005

(54) FILTER SYSTEM WITH BULK WAVE RESONATOR HAVING A REFLECTION LAYER COMPOSITION THAT VARIES WITH THE LAYER THICKNESS

(75) Inventors: Hans Peter Loebl, Monschau-Imgenbroich (DE); Mareike Katharine Klee, Hueckelhoven (DE); Robert Frederick Milsom, Redhill (GB); Christof Metzmacher, Aachen (DE); Wolfgang Brand, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 45 days.

(21) Appl. No.: 10/486,452

(22) PCT Filed: Aug. 5, 2002

(86) PCT No.: PCT/IB02/03291

§ 371 (c)(1),
(2), (4) Date: Feb. 10, 2004

(87) PCT Pub. No.: WO03/017481

PCT Pub. Date: Feb. 27, 2003

(65) Prior Publication Data

US 2004/0189423 A1 Sep. 30, 2004

(30) Foreign Application Priority Data

Aug. 14, 2001 (EP) .................................. 01306933

(51) Int. Cl.$^7$ .............................................. H03H 9/54
(52) U.S. Cl. ........................ 333/187; 333/189; 310/335
(58) Field of Search .............................. 333/187–192, 333/133; 310/335

(56) References Cited

U.S. PATENT DOCUMENTS

| | | | |
|---|---|---|---|
| 6,198,208 B1 * | 3/2001 | Yano et al. ................. | 310/358 |
| 6,239,536 B1 * | 5/2001 | Lakin ......................... | 310/364 |
| 6,339,276 B1 * | 1/2002 | Barber et al. ............... | 310/312 |
| 6,349,454 B1 * | 2/2002 | Manfra et al. ............. | 29/25.35 |
| 6,466,105 B1 * | 10/2002 | Lobl et al. ................. | 333/187 |
| 6,475,931 B2 * | 11/2002 | Bower et al. ............... | 438/800 |
| 6,709,776 B2 * | 3/2004 | Noguchi et al. ........... | 428/702 |
| 6,734,763 B2 * | 5/2004 | Nishihara et al. .......... | 333/187 |

FOREIGN PATENT DOCUMENTS

| | | | |
|---|---|---|---|
| EP | 1 067 685 A2 * | 1/2001 | |
| EP | 1 073 198 A2 * | 1/2001 | |
| WO | 9816957 A1 | 4/1998 | |

* cited by examiner

*Primary Examiner*—Barbara Summons
(74) *Attorney, Agent, or Firm*—Aaron Waxler

(57) ABSTRACT

The invention relates to a filter device equipped with at least one bulk acoustic wave resonator, which comprises a resonator unit and a reflection unit. The resonator unit comprises a first (3) and a second electrode (5) together with a textured piezoelectric layer (4) between the first (3) and second (5) electrodes.

11 Claims, 1 Drawing Sheet

Figure 1:
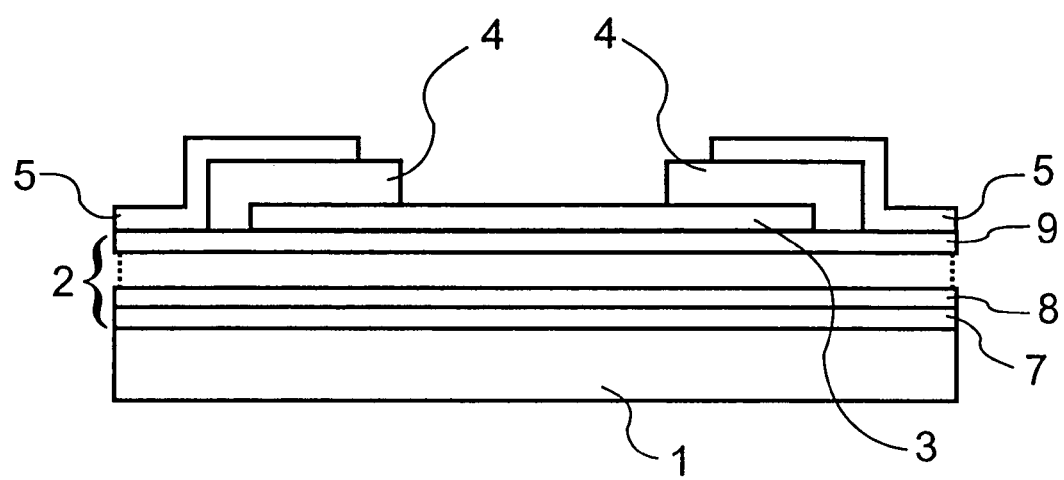

FILTER SYSTEM WITH BULK WAVE RESONATOR HAVING A REFLECTION LAYER COMPOSITION THAT VARIES WITH THE LAYER THICKNESS

The invention relates to a filter device equipped with at least one bulk acoustic wave resonator, which comprises a resonator unit and a reflection element, which resonator unit comprises a first and a second electrode together with a piezoelectric layer between the first and second electrodes. Furthermore, the invention also relates to a wireless data transmission system, a transmitter, a receiver and a mobile radio device equipped with a filter arrangement and a bulk acoustic wave resonator.

The very rapid developments in the area of mobile radio and the constant miniaturization of cordless telephones are leading to more stringent requirements as regards the individual components. A high degree of selectivity is necessary in the high-frequency section in order to protect the receiver from the increasing number of possibly interfering signals from other systems. This is achieved, for example, by bandpass filters, which allow only a limited frequency band through and suppress all frequencies above and below this range.

Such a filter may be, for example, a bulk acoustic wave (BAW) filter consisting of bulk acoustic wave resonators. Bulk acoustic wave resonators consist in principle of three components. The first component generates the acoustic wave and comprises a piezoelectric layer. Two electrodes, which are affixed above and below the piezoelectric layer, represent the second component. The third component, i.e. the reflection element, has the task of isolating the substrate acoustically from the oscillations generated by the piezoelectric layer.

Such a bulk acoustic wave resonator is known from WO 98/16957. The piezoelectric layer consists of ceramic materials such as, for example, ZnO or AlN.

In order to achieve a maximum bandwidth for a bulk acoustic wave filter consisting of bulk acoustic wave resonators, piezoelectric materials are needed which have a particularly high electromechanical coupling coefficient k. This is because the electromechanical coupling coefficient k determines the separation between the resonant frequency and the anti-resonant frequency of a bulk acoustic wave resonator.

It is therefore an object of the invention to provide a filter device with an improved bulk acoustic wave resonator, whose piezoelectric layer exhibits a high electromechanical coupling coefficient k.

This object is achieved by a filter device equipped with at least one bulk acoustic wave resonator, which comprises a resonator unit and a reflection element, which resonator unit comprises a first and a second electrode together with a textured piezoelectric layer between the first and second electrodes.

Texturing of the piezoelectric layer achieves a marked increase in the electromechanical coupling coefficient k relative to a polycrystalline piezoelectric layer. Due to the increased electromechanical coupling coefficient k, the separation between the resonant frequency and the anti-resonant frequency of the bulk acoustic wave resonator is enlarged and thus the bandwidth of the filter arrangement is widened.

It is preferable for the piezoelectric layer to be a monocrystalline layer.

A monocrystalline layer provides absolutely ideal texturing of the piezoelectric layer.

It is also preferable for the material of one electrode to be textured.

Production of a piezoelectric layer on a textured electrode allows textured application of the material of the piezoelectric layer.

It is advantageous for the reflection element to comprise a plurality of layers with alternately high and low acoustic impedance.

Such a reflection element is simple and inexpensive to produce.

It is particularly advantageous for a layer with high acoustic impedance to comprise a material selected from the group comprising $Ta_2O_5$, $Si_3N_4$, $TiO_2$, ZnO, $LiNbO_3$, $LiTaO_3$, $Al_2O_3$, SiC, $V_2O_5$, $Nb_2O_5$, $ZrO_2$, $La_2O_3$, $WO_x$ ($0<x\leq3$), $MoO_x$ ($0<x\leq3$), ZrC, WC, MoC, $ThO_2$, $CeO_2$, $Nd_2O_3$, $Pr_2O_3$, $Sm_2O_3$, $Gd_2O_3$, $ReO_x$ ($0<x\leq3.5$), $RuO_2$, $IrO_2$, $Y_2O_3$, $Sc_2O_3$, $LiGeO_2$, $Bi_{12}GeO_{20}$, $GeO_2$, MgO, yttrium-aluminum-garnet, yttrium-iron-garnet, $LiGaO_2$, $HfO_2$, AlN and C.

It is also particularly advantageous for a layer with low acoustic impedance to comprise a material selected from the group comprising $SiO_2$, aerogel and GaAs.

When the advantageous materials are used in the reflection element, material combinations with the largest possible differences in impedance may be produced. In addition, the materials exhibit moderate acoustic velocities, such that it is not necessary to use $\lambda/4$ layers of excessive thickness.

It may also be preferable for the reflection element to comprise a plurality of layers each with a mixture of at least two materials, the composition of the mixture within each layer varying continuously and periodically relative to the layer thickness.

In the case of such a reflection element, the layer properties in each layer do not vary according to a square wave function, but rather continuously, for example, sinusoidally. In this way, a reflection element may be produced which exhibits high reflection in the pass band of the filter device and thus effectively decouples from the filter arrangement the substrate on which the filter device is located. Outside the pass band of the filter arrangement, the reflection element may exhibit high acoustic wave transmission. In this way, outside its pass band the filter device is acoustically coupled to the substrate and effectively suppresses higher harmonic frequencies outside the pass band.

The invention additionally relates to a transmitter, a receiver, a mobile radio device and a wireless data transmission system equipped with a filter arrangement having at least one bulk acoustic wave resonator, which comprises a resonator unit and a reflection element, which resonator unit comprises a first and a second electrode together with a textured piezoelectric layer between the first and second electrodes. The invention also relates to a bulk acoustic wave resonator, which comprises a resonator unit and a reflection element, which resonator unit comprises a first and a second electrode together with a textured piezoelectric layer between the first and second electrodes.

The invention will be described in detail hereinafter with reference to a FIGURE and ten embodiments, to which, however, the invention is not restricted.

FIG. 1 is a cross-sectional representation of the structure of a filter arrangement of bulk acoustic wave resonators.

According to FIG. 1, a bulk acoustic wave filter device comprises a substrate 1, which consists for example of a ceramic material, a ceramic material with a planarization layer of glass, a glass-ceramic material, a glass material, a semiconductor material, such as for example silicon, GaAs, InP, SiC or GaN, or sapphire. If a semiconductor material is used as the substrate 1, a passivation layer of $SiO_2$ or glass, for example, may also be applied. A reflection element 2 is located on the substrate 1. The reflection element 2 preferably comprises a plurality of layers 7, 8, 9 with alternately high and low acoustic impedance. The thickness of the layers 7, 8, 9 amounts in each case to a quarter of the resonant wavelength $\lambda$. The total number of layers of the reflection element 2 is preferably between 3 and 12.

For a layer with high acoustic impedance, a material is preferably used which is selected from the group comprising $Ta_2O_5$, $Si_3N_4$, $TiO_2$, $ZnO$, $LiNbO_3$, $LiTaO_3$, $Al_2O_3$, $SiC$, $V_2O_5$, $Nb_2O_5$, $ZrO_2$, $La_2O_3$, $WO_x$ ($0<x\leq3$), $MoO_x$ ($0<x\leq3$), $ZrC$, $WC$, $MoC$, $ThO_2$, $CeO_2$, $Nd_2O_3$, $Pr_2O_3$, $Sm_2O_3$, $Gd_2O_3$, $ReO_x$ ($0<x\leq3.5$), $RuO_2$, $IrO_2$, $Y_2O_3$, $Sc_2O_3$, $LiGeO_2$, $Bi_{12}GeO_{20}$, $GeO_2$, $MgO$, yttrium-aluminum-garnet, yttrium-iron-garnet, $LiGaO_2$, $HfO_2$, $AlN$ and $C$. For a layer with low acoustic impedance a material is preferably selected from the group comprising $SiO_2$, aerogel and GaAs. It is preferable for the reflection element 2 to comprise alternating layers of $Ta_2O_5$ and $SiO_2$ or $Si_3N_4$ and $SiO_2$.

Alternatively, the reflection element 2 may consist of only a single layer with an acoustic reflection material, which exhibits low acoustic impedance. This acoustic reflection material may be an aerogel, a xerogel, a foamed glass, a foam-like adhesive, a foam or a low density plastics material.

It is also possible for the reflection element 2 to comprise a plurality of layers 7, 8, 9 each with a mixture of at least two materials; the composition of the mixture, which is preferably amorphous, within each layer 7, 8, 9 then varies continuously and periodically relative to the layer thickness. It is then preferable for each layer 7, 8, 9 of the reflection element 2 to comprise a mixture of $SiO_2$ and $Ta_2O_5$ or $SiO_2$ and $Si_3N_4$. In this embodiment, the composition of the mixture varies periodically, for example sinusoidally, relative to the layer thickness in a layer 7, 8, 9.

Resonator units are applied to the reflection element 2, which resonator units each comprise a first electrode 3, a piezoelectric layer 4 and a second electrode 5. The electrodes 3 and 5 are preferably made of a suitably conductive material with low acoustic absorption.

As the material for the piezoelectric layer 4, it is possible to use, for example, AlN, ZnO, $Pb(Zn_{1/3}Nb_{2/3})O_3$—$PbTiO_3$, $Pb(Mg_{1/3}Nb_{2/3})O_3$—$PbTiO_3$, $Pb(Ni_{1/3}Nb_{2/3})O_3$—$PbTiO_3$, $Pb(Sc_{1/3}Nb_{2/3})O_3$—$PbTiO_3$, $Pb(Zn_{1/3}Nb_{2/3})_{1-x-y}(Mn_{1/2}Nb_{1/2})_xTi_yO_3$ ($0\leq x\leq1$, $0\leq y\leq1$), $Pb(In_{1/2}Nb_{1/2})O_3$—$PbTiO_3$, $Sr_3TaGa_3Si_2O_{14}$, $K(Sr_{1-x}Ba_x)_2Nb_5O_{15}$ ($0\leq x\leq1$); $Na(Sr_{1-x}Ba_x)_2Nb_5O_{15}$ ($0\leq x\leq1$), $BaTiO_3$, $(K_{1-x}Na_x)NbO_3$ ($0\leq x\leq1$), $KTaO_3$, $(Bi,Na,K, Pb,Ba)TiO_3$, $(Bi,Na)TiO_3$, $Bi_7Ti_4NbO_{21}$, $(K_{1-x}Na_x)NbO_3$—$(Bi,Na,K,Pb,Ba)TiO_3$ ($0\leq x\leq1$), $a(Bi_xNa_{1-x})TiO_{3-b}(KNbO_{3-c})\frac{1}{2}(Bi_2O_3$—$Sc_2O_3)$ ($0\leq x\leq1$, $a+b+c=1$), $(Ba_aSr_bCa_c)Ti_xZr_{1-x}O_3$ ($0\leq x\leq1$, $a+b+c=1$), $(Ba_aSr_bLa_c)Bi_4Ti_4O_{15}$ ($a+b+c=1$), $Bi_4Ti_3O_{12}$, $LiNbO_3$, $La_3Ga_{5.5}Nb_{0.5}O_{14}$, $La_3Ga_5SiO_{14}$, $La_3Ga_{5.5}Ta_{0.5}O_{14}$ and $PbZr_xTi_{1-x}O_3$ ($0\leq x\leq1$) with and without dopants of La, Mn, Fe, Sb, Sr, Ni or combinations of these dopants.

To achieve high electromechanical coupling coefficients k, the material in the piezoelectric layer 4 is applied with texture. In a textured piezoelectric layer 4, the crystals of the piezoelectric material exhibit a preferred orientation of the crystallites with regard to an external sample geometry and are not arranged so as to exhibit random crystallographic orientation relative to one another. It is preferable for the material in the piezoelectric layer 4 to be applied with columnar growth.

A textured, piezoelectric layer 4 may be achieved by thin film methods such as for example sol-gel processes, sputtering, CVD (Chemical Vapor Deposition) processes or printing processes. The piezoelectric layer 4 may also be applied to the first electrode 3 by bonding or adhesion of already sintered, machined layers of the piezoelectric materials.

A further alternative is the so-called "Templated Grain Growth" (TGG) method. In this method, a polycrystalline layer is applied to a monocrystalline template. The polycrystalline layer is converted into a textured/monocrystalline layer by heating to high temperatures.

The texture of the piezoelectric layer 4 may be improved to the point of monocrystallinity by further processes such as, for example, laser annealing.

To improve the growth, crystallinity and orientation of the material of the piezoelectric layer 4, a nucleation layer, for example of $PbZr_xTi_{1-x}O_3$ with $0\leq x\leq1$ or $PbTiO_3$, may be applied to the first electrode 3.

By depositing the piezoelectric layer 4 onto a textured first electrode 3, it is possible to influence the texture of the piezoelectric layer 4.

Where AlN or ZnO are used as the piezoelectric material in the piezoelectric layer 4, suitable materials for a textured electrode 3, 5, include metals which preferably exhibit a cubic face-centered or hexagonally maximally densely packed structure, and whose surface exhibits a (111) orientation with hexagonal arrangement of the atoms. Examples of possible materials for a textured electrode 3, 5 with cubic face-centered packing and (111) orientation are Pt, Al, Al:Si, Al:Cu, Ti, Ni, Cu, Rh, Pd, Ag, Ir, Au, Ce and Yb. Examples of possible materials for a textured electrode 3, 5 with hexagonally maximally dense packing and (111) orientation are Ti, Co, Zn, Y, Zr, Tc, Ru, Hf. Re, Os, Pr, Nd, Pm, Sm, Gd, Tb, Dy, Ho, Er, Tm and Lu. Alternatively, layer systems consisting of various metals are also suitable materials. Thus, a textured electrode 3, 5 may comprise Ti/Pt, Ti/Al, Ti/Al:Si and Ti/Al:Cu, for example. The use of alloys of metals which exhibit cubic face-centered packing and (111) orientation is also possible. Alloys may also be used which consist of metals which exhibit cubic face-centered packing and (111) orientation together with metals or non-metals which exhibit, for example, cubic body-centered packing and whose surface transforms into hexagonal symmetry spontaneously or by the adsorption of foreign atoms. One such possible alloy is $Pt_{0.68}Ni_{0.32}$.

The c-axis orientation of a textured piezoelectric layer 4, which is determined by the FWHM (Full Width at Half Maximum) width of the rocking curve of the (0001) peak, amounts for AlN or ZnO preferably to <3°.

When using $Pb(Zn_{1/3}Nb_{2/3})O_3$—$PbTiO_3$, $Pb(Mg_{1/3}Nb_{2/3})O_3$—$PbTiO_3$, $Pb(Ni_{1/3}Nb_{2/3})O_3$—$PbTiO_3$, $Pb(Sc_{1/3}Nb_{2/3})O_3$—$PbTiO_3$, $Pb(Zn_{1/3}Nb_{2/3})_{1-x-y}(Mn_{1/2}Nb_{1/2})_xTi_yO_3$ ($0\leq x\leq1$, $0\leq y\leq1$), $Pb(In_{1/2}Nb_{1/2})O_3$—$PbTiO_3$, $Sr_3TaGa_3Si_2O_{14}$, $K(Sr_{1-x}Ba_x)_2Nb_5O_{15}$ ($0\leq x\leq1$), $Na(Sr_{1-x}Ba_x)_2Nb_5O_{15}$ ($0\leq x\leq1$), $BaTiO_3$, $(K_{1-x}Na_x)NbO_3$ ($0\leq x\leq1$), $KTaO_3$, $(Bi,Na,K,Pb,Ba)TiO_3$, $(Bi,Na)TiO_3$, $Bi_7Ti_4NbO_{21}$, $(K_{1-x}Na_x)NbO_3$—$(Bi,Na,K,Pb,Ba)TiO_3$ ($0\leq x\leq1$), $a(Bi_xNa_{1-x})TiO_{3-b}(KNbO_{3-c})\frac{1}{2}(Bi_2O_3$—$Sc_2O_3)$ ($0\leq x\leq1$, $a+b+c=1$), $(Ba_aSr_bCa_c)Ti_xZr_{1-x}O_3$ ($0\leq x\leq1$, $a+b+c=1$), $(Ba_aSr_bLa_c)Bi_4Ti_4O_{15}$ ($a+b+c=1$), $Bi_4Ti_3O_{12}$, $LiNbO_3$, $La_3Ga_{5.5}Nb_{0.5}O_{14}$, $La_3Ga_5SiO_{14}$, $La_3Ga_{5.5}Ta_{0.5}O_{14}$ and $PbZr_xTi_{1-x}O_3$ ($0\leq x\leq1$) with and without dopants of La, Mn, Fe, Sb, Sr, Ni or combinations as the piezoelectric material, it is also possible for the texture of the piezoelectric layer 4 to be influenced by deposition of the piezoelectric layer 4 onto a textured first electrode 3.

Alternatively, with these piezoelectric materials, it is also possible to influence the texture of the piezoelectric layer 4 by means of a textured barrier layer, which is applied between the reflection element 2 and the first electrode 3.

Thus, for example, it is possible to grow a piezoelectric layer 4 with (111) orientation by using a first electrode 3 of Pt with (111) orientation which has not been thermally pretreated. By using a first electrode 3 of Pt with (111) orientation which has been thermally pretreated, it is possible to grow piezoelectric layers 4 with (100) orientation and (111) orientation or solely with (100) orientation.

By using a barrier layer of MgO with (100) orientation, it is possible to grow first (100)-oriented Pt as the first electrode 3. In this way, the above-listed piezoelectric materials may be grown as a textured layer on the textured first electrode 3.

A protective layer of an organic or an inorganic material or a combination of these materials may be applied over the entire filter arrangement. The organic material may comprise for example polybenzocyclobutene or polyimide and the inorganic material may comprise, for example, $Si_3N_4$, $SiO_2$ or $Si_xO_yN_z$ ($0 \leq x \leq 1, 0 \leq y \leq 1, 0 \leq z \leq 1$). Alternatively, a thin layer of $SiO_2$ may be applied to one or more bulk acoustic wave resonators of the filter arrangement for specific detuning of the bulk acoustic wave resonator. It may be preferable for the thin layer of $SiO_2$ to be applied only to the second electrode 5 of bulk acoustic wave resonator. The layer thickness of the thin layer of $SiO_2$ preferably amounts to between 10 and 100 nm.

A filter device according to the invention may be used, for example, for signal filtering in a wireless data transmission system, in a mobile radio device, in a transmitter or in a receiver.

Embodiments of the invention, representing possible examples of implementation, are elucidated below.

Embodiment 1

A filter device of bulk acoustic wave resonators comprises a substrate 1 of silicon with a passivation layer of $SiO_2$. A reflection element 2, which comprises seven layers alternately of $SiO_2$ and $Si_3N_4$, is applied to the substrate 1. The first layer 7 on the substrate 1 comprises $SiO_2$. On the top layer 9 of the reflection element 2, which comprises $SiO_2$, there are located the individual bulk acoustic wave resonators, which each comprise a first electrode 3, a piezoelectric layer 4 and a second electrode 5. The first electrode 3 comprises Ti/Pt, the Pt-containing layer of the first electrode 3 being grown with (111) orientation. A layer of $PbZr_{0.35}Ti_{0.65}O_3$ with (100) orientation and (111) orientation is applied to each first electrode 3 as the piezoelectric layer 4. A second electrode 5 of TiW/Al is located on each piezoelectric layer 4. A thin layer of $SiO_2$ is located on the second electrode 5 of each bulk acoustic wave resonator. The individual bulk acoustic wave resonators are connected electrically on the substrate 1 in such a way that a filter arrangement is obtained for signal filtering in the high frequency section of a mobile radio device.

Embodiment 2

A filter device of bulk acoustic wave resonators comprises a substrate 1 of glass. A reflection element 2, which comprises seven layers alternately of $SiO_2$ and $Ta_2O_5$, is applied to the substrate 1. The first layer 7 on the substrate 1 comprises $SiO_2$. On the top layer 9 of the reflection element 2, which comprises $SiO_2$, there are located the individual bulk acoustic wave resonators, which each comprise a first electrode 3, a piezoelectric layer 4 and a second electrode 5. The first electrode 3 comprises Ti/Pt, the Pt-containing layer of the first electrode 3 being grown with (111) orientation. A piezoelectric layer 4 of $PbZr_{0.35}Ti_{0.65}O_3$ with (100) orientation and (111) orientation is applied to each first electrode 3. A second electrode 5 of Pt is located on each piezoelectric layer 4. A thin layer of $SiO_2$ is located on the second electrode 5 of each bulk acoustic wave resonator. The individual bulk acoustic wave resonators are connected electrically on the substrate 1 in such a way that a filter arrangement is obtained for signal filtering in the high frequency section of a mobile radio device.

Embodiment 3

A filter device of bulk acoustic wave resonators comprises a substrate 1 of silicon with a passivation layer of $SiO_2$. A reflection element 2, which comprises seven layers alternately of $SiO_2$ and $Ta_2O_5$, is applied to the substrate 1. The first layer 7 on the substrate 1 comprises $SiO_2$. On the top layer 9 of the reflection element 2, which comprises $SiO_2$, there are located the individual bulk acoustic wave resonators, which each comprise a first electrode 3, a piezoelectric layer 4 and a second electrode 5. The first electrode 3 comprises Ti/Pt, wherein the Pt-containing layer of the first electrode 3 being grown with (111) orientation. A thin nucleation layer of $PbZr_{0.35}Ti_{0.65}O_3$ is applied to each first electrode 3. A layer of $KbNO_3$ with (001) orientation is grown on each nucleation layer as the piezoelectric layer 4. A second electrode 5 of TiW/Al is located on each piezoelectric layer 4. A thin layer of $SiO_2$ is located on the second electrode 5 of each bulk acoustic wave resonator. The individual bulk acoustic wave resonators are connected electrically on the substrate 1 in such a way that a filter arrangement is obtained for signal filtering in the high frequency section of a mobile radio device.

Embodiment 4

A filter device of bulk acoustic wave resonators comprises a substrate 1 of glass. A reflection element 2, which comprises a layer of porous $SiO_2$, is applied to the substrate 1. On the reflection element 2 there are located the individual bulk acoustic wave resonators, which each comprise a first electrode 3, a piezoelectric layer 4 and a second electrode 5. The first electrode 3 comprises Ti/Pt, the Pt-containing layer of the first electrode 3 being grown with (111) orientation. A layer of $Pb(Mg_{1/3}Nb_{2/3})O_3$—$PbTiO_3$ with (001) orientation and (111) orientation is grown on each first electrode 3 as the piezoelectric layer 4. A second electrode 5 of Pt is located on each piezoelectric layer 4. A thin layer of $SiO_2$ is located on the second electrode 5 of each bulk acoustic wave resonator. The individual bulk acoustic wave resonators are connected electrically on the substrate 1 in such a way that a filter arrangement is obtained for signal filtering in the high frequency section of a mobile radio device.

Embodiment 5

A filter device of bulk acoustic wave resonators comprises a substrate 1 of silicon with a passivation layer of $SiO_2$. A reflection element 2, which comprises seven layers alternately of $SiO_2$ and $Ta_2O_5$, is applied to the substrate 1. The first layer 7 on the substrate 1 comprises $SiO_2$. On the top layer 9 of the reflection element 2, which comprises $SiO_2$, there is applied a barrier layer of MgO with (100) orientation. On the barrier layer there are located the individual bulk acoustic wave resonators, which each comprise a first electrode 3, a piezoelectric layer 4 and a second electrode 5. The first electrode 3 comprises Ti/Pt, the Pt-containing layer of the first electrode 3 being grown with (100) orientation. A layer of $Pb(Zn_{1/3}Nb_{2/3})O_3$—$PbTiO_3$ with (001) orientation is applied to each first electrode 3 as the piezoelectric layer 4. A second electrode 5 of Pt is located on each piezoelectric layer 4. A thin layer of $SiO_2$ is located on the second electrode 5 of each bulk acoustic wave resonator.

The individual bulk acoustic wave resonators are connected electrically on the substrate 1 in such a way that a filter arrangement is obtained for signal filtering in the high frequency section of a mobile radio device.

Embodiment 6

A filter device of bulk acoustic wave resonators comprises a substrate 1 of glass. A reflection element 2, which comprises seven layers, is applied to the substrate 1. Each of the layers 7, 8, 9 comprises as materials $SiO_2$ and $Ta_2O_5$; within each layer 7, 8, 9 the composition of the material varies sinusoidally, with the layer thickness d constituting the period, from pure $SiO_2$ to pure $Ta_2O_5$ and back to pure $SiO_2$. The layer thickness d of each layer 7, 8, 9 amounts to 466 nm. On the top layer 9 of the reflection element 2, there are located the individual bulk acoustic wave resonators, which each comprise a first electrode 3, a piezoelectric layer 4 and a second electrode 5. The first electrode 3 comprises Ti/Pt, the Pt-containing layer of the first electrode 3 being grown with (111) orientation. A thin nucleation layer of $PbZr_{0.35}Ti_{0.65}O_3$ is applied to each first electrode 3. A layer of $Pb(Zn_{1/3}Nb_{2/3})O_3$—$PbTiO_3$ with (001) orientation is grown on each nucleation layer as the piezoelectric layer 4. A second electrode 5 of Pt is located on each piezoelectric layer 4. A thin layer of $SiO_2$ is located on the second electrode 5 of each bulk acoustic wave resonator. The individual bulk acoustic wave resonators are connected electrically on the substrate 1 in such a way that a filter arrangement is obtained for signal filtering in the high frequency section of a mobile radio device.

Embodiment 7

A filter decive of bulk acoustic wave resonators comprises a substrate 1 of silicon with a passivation layer of $SiO_2$. A reflection element 2, which comprises seven layers alternately of $SiO_2$ and $Ta_2O_5$, is applied to the substrate 1. The first layer 7 on the substrate 1 comprises $SiO_2$. On the top layer 9 of the reflection element 2, which comprises $SiO_2$, there are located the individual bulk acoustic wave resonators, which each comprise a first electrode 3, a piezoelectric layer 4 and a second electrode 5. The first electrode 3 comprises Ti/Pt, the Pt-containing layer of the first electrode 3 being grown with (111) orientation. A textured layer of AlN with (0001) orientation is applied to each first electrode 3 as the piezoelectric layer 4. A second electrode 5 of Al is located on each piezoelectric layer 4. A thin layer of $SiO_2$ is located on the second electrode 5 of each bulk acoustic wave resonator. The individual bulk acoustic wave resonators are connected electrically on the substrate 1 in such a way that a filter arrangement is obtained for signal filtering in the high frequency section of a mobile radio device.

Embodiment 8

A filter device of bulk acoustic wave resonators comprises a substrate 1 of silicon with a passivation layer of $SiO_2$. A reflection element 2, which comprises seven layers alternately of $SiO_2$ and $Si_3N_4$, is applied to the substrate 1. The first layer 7 on the substrate 1 comprises $SiO_2$. On the top layer 9 of the reflection element 2, which comprises $SiO_2$, there are located the individual bulk acoustic wave resonators, which each comprise a first electrode 3, a piezoelectric layer 4 and a second electrode 5. The first electrode 3 comprises Ti/Pt, the Pt-containing layer of the first electrode 3 being grown with (111) orientation. A textured layer of AlN with (0001) orientation is applied to each first electrode 3 as the piezoelectric layer 4. A second electrode 5 of Al is located on each piezoelectric layer 4. A thin layer of $SiO_2$ is located on the second electrode 5 of each bulk acoustic wave resonator. The individual bulk acoustic wave resonators are connected electrically on the substrate 1 in such a way that a filter arrangement is obtained for signal filtering in the high frequency section of a mobile radio device.

Embodiment 9

A filter device of bulk acoustic wave resonators comprises a substrate 1 of silicon with a passivation layer of $SiO_2$. A reflection element 2, which comprises nine layers alternately of $SiO_2$ and $Ta_2O_5$, is applied to the substrate 1. The first layer 7 on the substrate 1 comprises $SiO_2$. On the top layer 9 of the reflection element 2, which comprises $SiO_2$, there are located the individual bulk acoustic wave resonators, which each comprise a first electrode 3, a piezoelectric layer 4 and a second electrode 5. The first electrode 3 comprises Ti/Al:Cu with (111) orientation. A textured layer of AlN with (0001) orientation is applied to each first electrode 3 as the piezoelectric layer 4. A second electrode 5 of Al is located on each piezoelectric layer 4. A thin layer of $SiO_2$ is located on the second electrode 5 of each bulk acoustic wave resonator. The individual bulk acoustic wave resonators are connected electrically on the substrate 1 in such a way that a filter arrangement is obtained for signal filtering in the high frequency section of a mobile radio device.

Embodiment 10

A filter device of bulk acoustic wave resonators comprises a substrate 1 of silicon with a passivation layer of $SiO_2$. A reflection element 2, which comprises nine layers alternately of $SiO_2$ and $Ta_2O_5$, is applied to the substrate 1. The first layer 7 on the substrate 1 comprises $SiO_2$. On the top layer 9 of the reflection element 2, which comprises $SiO_2$, there are located the individual bulk acoustic wave resonators, which each comprise a first electrode 3, a piezoelectric layer 4 and a second electrode 5. The first electrode 3 comprises Ti/Pt, the Pt-containing layer of the first electrode 3 being grown with (111) orientation. A textured layer of ZnO with (0001) orientation is applied to each first electrode 3 as the piezoelectric layer 4. A second electrode 5 of Al is located on each piezoelectric layer 4. A thin layer of $SiO_2$ is located on the second electrode 5 of each bulk acoustic wave resonator. The individual bulk acoustic wave resonators are connected electrically on the substrate 1 in such a way that a filter arrangement is obtained for signal filtering in the high frequency section of a mobile radio device.

What is claimed is:

1. A filter device equipped with at least one bulk acoustic wave resonator, which comprises a resonator unit and a reflection element (2), which resonator unit comprises a first and a second electrode (3, 5) together with a textured piezoeleciric layer (4) between the first and second electrodes (3, 5), wherein the reflection element (2) comprises a plurality of layers (7, 8, 9) each with a mixture of at least two materials, the composition of the mixture within each layer varying continuously and periodically relative to the layer thickness.

2. A filter device as claimed in claim 1, characterized in that the piezoelectric layer (4) is a monocrystalline layer.

3. A filter device as claimed in claim 1, characterized in that the material of one electrode (3, 5) is textured.

4. A filter device as claimed in claim 1, characterized in that the reflection element (2) comprises a plurality of layers (7, 8, 9) with alternately high and low acoustic impedance.

5. A filter device as claimed in claim 4, characterized in that a layer with high acoustic impedance comprises a material selected from the group comprising $Ta_2O_5$, $Si_3N_4$, $TiO_2$, ZnO, $LiNbO_3$, $LiTaO_3$, $Al_2O_3$, SiC, $V_2O_5$, $Nb_2O_5$, $ZrO_2$, $La_2O_3$, $WO_x$ ($0<x \leq 3$), $MoO_x$ ($0<x \leq 3$), ZrC, WC, MoC, $ThO_2$, $CeO_2$, $Nd_2O_3$, $Pr_2O_3$, $Sm_2O_3$, $Gd_2O_3$, $ReO_x$ ($0 < x \leq 3.5$), $RuO_2$, $IrO_2$, $Y_2O_3$, $Sc_2O_3$, $LiGeO_2$, $Bi_{12}GeO_{20}$, $GeO_2$, MgO, yttrium-aluminum-garnet, yttrium-iron-garnet, $LiGaO_2$, $HfO_2$, AlN and C.

6. A filter device as claimed in claim 4, characterized in that a layer with low acoustic impedance comprises a material selected from the group comprising $SiO_2$, aerogel and GaAs.

7. A bulk acoustic wave resonator, which comprises a resonator unit and a reflection element (2), which resonator unit comprises a first and a second electrode (3, 5) together with a textured piezoelectric layer (4) between the first and second electrodes (3, 5), wherein the reflection element (2) comprises a plurality of layers (7, 8, 9) each with a mixture of at least two materials, the composition of the mixture within each layer varying continuously and periodically relative to the layer thickness.

8. A mobile radio device equipped with a filter device having at least one bulk acoustic wave resonator, which comprises a resonator unit and a reflection element (2), which resonator unit comprises a first and a second electrode (3, 5) together with a textured piezoelectric layer (4) between the first and second electrodes (3, 5), wherein the reflection element (2) comprises a plurality of layers (7, 8, 9) each with a mixture of at least two materials, the composition of the mixture within each layer varying continuously and periodically relative to the layer thickness.

9. A transmitter equipped with a filter device having at least one bulk acoustic wave resonator, which comprises a resonator unit and a reflection element (2), which resonator unit comprises a first and a second electrode (3, 5) together with a textured piezoelectric layer (4) between the first and second electrodes (3, 5), wherein the reflection element (2) comprises a plurality of layers (7, 8, 9) each with a mixture of at least two materials, the composition of the mixture within each layer varying continuously and periodically relative to the layer thickness.

10. A receiver equipped with a filter device having at least one bulk acoustic wave resonator, which comprises a resonator unit and a reflection element (2), which resonator unit comprises a first and a second electrode (3, 5) together with a textured piezoelectric layer (4) between the first and second electrodes (3, 5), wherein the reflection element (2) comprises a plurality of layers (7, 8, 9) each with a mixture of at least two materials, the composition of the mixture within each layer varying continuously and periodically relative to the layer thickness.

11. A wireless data transmission system equipped with a filter device having at least one bulk acoustic wave resonator, which comprises a resonator unit and a reflection element (2), which resonator unit comprises a first and a second electrode (3, 5) together with a textured piezoelectric layer (4) between the first and second electrodes (3, 5), wherein the reflection element (2) comprises a plurality of layers (7, 8, 9) each with a mixture of at least two materials, the composition of the mixture within each layer varying continuously and periodically relative to the layer thickness.

* * * * *